United States Patent
Hongo et al.

(10) Patent No.: US 7,061,950 B2
(45) Date of Patent: Jun. 13, 2006

(54) DRIVE CIRCUIT AND DRIVE METHOD OF SEMICONDUCTOR LASER MODULE PROVIDED WITH ELECTRO-ABSORPTION TYPE OPTICAL MODULATOR

(75) Inventors: Kazuhiro Hongo, Kawasaki (JP); Yuji Miyaki, Kawasaki (JP); Kazuhiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 109 days.

(21) Appl. No.: 10/355,285

(22) Filed: Jan. 31, 2003

(65) Prior Publication Data

US 2004/0028099 A1 Feb. 12, 2004

(30) Foreign Application Priority Data

Jul. 24, 2002 (JP) ............................. 2002-215749

(51) Int. Cl.
*H01S 3/13* (2006.01)
*H01S 3/04* (2006.01)
*H01S 3/00* (2006.01)

(52) U.S. Cl. .................. 372/38.02; 372/34; 372/38.07; 372/29.015

(58) Field of Classification Search ............ 372/38.02, 372/12, 11, 26, 29.015, 38.07, 8, 34
See application file for complete search history.

(56) References Cited

U.S. PATENT DOCUMENTS

| 5,035,495 | A | * | 7/1991 | Toyoda et al. ............... 359/512 |
| 5,917,637 | A | * | 6/1999 | Ishikawa et al. ............ 398/197 |
| 2003/0012244 | A1 | * | 1/2003 | Krasulick et al. ............. 372/50 |

FOREIGN PATENT DOCUMENTS

JP 11-119176 4/1999

* cited by examiner

*Primary Examiner*—Armando Rodriguez
(74) *Attorney, Agent, or Firm*—Staas & Halsey LLP

(57) ABSTRACT

The present invention aims at providing a drive circuit and a drive method for a semiconductor laser module including an electro-absorption type optical modulator, capable of obtaining a stable optical output without controlling a module temperature to be constant. To this end, the drive circuit of the present invention detects a temperature in the semiconductor laser module comprising a semiconductor laser and an EA modulator, and based on the detected temperature, controls a drive current supplied to the semiconductor laser and a bias voltage and a modulated electric signal applied to the EA modulator, so that average power, an extinction ratio and an optical cross point of an optical signal output from the semiconductor laser module are held to be constant.

13 Claims, 14 Drawing Sheets

EXAMPLE OF COMPLEMENT BY POLYNOMIAL APPROXIMATION

EXAMPLE OF INTER-DATA LINEAR COMPLEMENT (A)
LOW LEVEL OUTPUT TIME (B)
HIGH LEVEL OUTPUT TIME (A)
LOAD = ONLY RESISTOR
(SETTING OF MODULATED AMPLITUDE CONTROL SECTION)

$V_{pp} = V_{on} - V_{off}$ (B)
LOAD = RESISTOR + EA
(ACTUAL OUTPUT)

$V_{pp} = (V_{on} + I_{photo\_on} \times R) - (V_{off} + I_{photo\_on} \times R)$
$= V_{on} - V_{off} + (I_{photo\_on} - I_{photo\_off}) \times R$
$= V_{on} - V_{off} + \Delta I_{photo} \times R$

DRIVE CIRCUIT AND DRIVE METHOD OF SEMICONDUCTOR LASER MODULE PROVIDED WITH ELECTRO-ABSORPTION TYPE OPTICAL MODULATOR

BACKGROUND OF THE INVENTION

1. Field of the Invention

The present invention relates to a drive circuit and a drive method of a semiconductor laser module that externally modulates carrier light output from a semiconductor laser using an electro-absorption type optical modulator to output the modulated light, in particular, to a drive control technique for compensating for temperature characteristics of the semiconductor laser and the electro-absorption type optical modulator.

2. Description of the Related Art

In various optical communication systems for transmitting optical signals over a long distance, there is sometimes used a semiconductor laser module in which a semiconductor laser and an external modulator of electro-absorption type are integrated with each other, since such a semiconductor laser module enables to increase a transmission distance compared with a semiconductor laser of direct modulation type. In the aforementioned semiconductor laser module, operation characteristics of the semiconductor laser and the electro-absorption type optical modulator (hereinafter referred to as EA modulator) each has dependence on temperature. Therefore, in order to hold optical output power in stable, it is necessary to stabilize a module temperature or to control a drive condition according to a temperature change.

In a conventional drive control of a semiconductor laser module having an EA modulator, such a method is typical in that, for example, by using an electronic cooling device such as a Peltier device and a temperature detection device such as a thermistor integrated with each other in a module, a current to be supplied to the Peltier device is controlled so that a resistance value of the thermistor is maintained to be constant, to hold the temperature of a semiconductor laser and the EA modulator to be constant. In this case, the EA modulator is driven by a constant modulated electric signal and at the same time, a constant drive current or a drive current to make a back power monitor current constant is supplied to the semiconductor laser, thereby achieving a stable optical output. The drive control method described above, however, has a disadvantage that since the Peltier device needs to be driven, the power consumption is increased and also a package size of the module is made to be large.

To cope with this problem, a semiconductor laser module using an EA modulator which is not provided with a Peltier device, has recently been under development. According to this semiconductor laser module, both the reduction of power consumption and the miniaturization can be achieved by eliminating the need of a Peltier device, although there is a need of stabilizing optical output power by controlling a bias voltage of the EA modulator or a drive current of the semiconductor laser according to a temperature change. Also, since this module is of an external modulation system using the EA modulator, it is possible to obtain an optical output having a small amount of chirping.

As a conventional drive control technique applicable to such a semiconductor laser module without the Peltier device as described above, a drive circuit for an EA modulator is disclosed in Japanese Unexamined Patent Publication No. 11-119176. In this drive circuit, an anode voltage of the EA modulator is detected and according to the detection result, a bias voltage of the EA modulator is controlled, so that an applied voltage to the EA modulator is maintained to be constant even if a temperature change or a change with age occurs.

However, in the case where the semiconductor laser module provided with EA modulator without the Peltier device is driven by applying the conventional control technique as described above, although the bias voltage of the EA modulator is controlled according to the temperature change and the like, since the EA modulator is driven by a constant modulated electric signal, an optical output waveform of the semiconductor laser module is considerably deteriorated.

FIG. 16 is a diagram showing temperature dependence of operating characteristics of a typical EA modulator. In FIG. 16, each characteristic curve represents a relation between power Pf of an optical signal output from the EA modulator and an applied voltage Vea to the EA modulator at each of temperatures 0° C., 25° C. and 75° C. In FIG. 16, if a modulated electric signal of a waveform as shown in the lower left part is applied to drive the EA modulator, since the optical output power Pf is changed along each characteristic curve, an optical waveform at 0° C. output from the EA modulator is considerably deteriorated as compared with an optical waveform at 75° C. as shown in the upper right part. Even if the bias voltage is controlled according to the temperature change as in the conventional technique so that the EA modulator operates in a region where the characteristic curve has the large inclination and is changed substantially linearly, since the inclination or the distortion of the characteristic curve in each operating region differs from each other depending on the temperature, an extinction ratio or a duty of the optical output waveform is changed depending on temperature when the EA modulator is driven by the modulated electric signal in which a modulated amplitude and a cross point are set to be constant.

Further, since a current generated by absorption of carrier light (hereinafter referred to as a photocurrent) flows through the EA modulator, there is caused a problem in that the applied voltage to the EA modulator deviates, if the photocurrent is changed when controlling a current source for drive controlling the EA modulator. Therefore, for the semiconductor laser module without the Peltier device, it is critically important to realize a drive control method that is not affected by a change in the photocurrent due to the electro-absorption effect, when the temperature change or the change with age is compensated by controlling the electrical drive signal of the EA modulator.

SUMMARY OF THE INVENTION

The present invention has been accomplished in view of the aforementioned problems, and has an object to provide a drive circuit and a drive method for a semiconductor module provided with an EA modulator, capable of obtaining a stable optical output without a need of controlling a temperature of the module to be constant.

In order to achieve the object described above, according to the present invention, there is provided a drive circuit for driving a semiconductor module including a semiconductor laser generating carrier light according to a drive current and an electro-absorption type optical modulator outputting an optical signal of which intensity is modulated by absorbing the carrier light output from the semiconductor laser according to the drive voltage, the drive circuit comprising: a laser drive unit; an optical modulator drive unit; a temperature detection unit; and a drive control unit. The laser drive unit supplies a drive current to the semiconductor laser. The optical modulator drive unit applies a drive voltage in which a modulated electric signal is superimposed on a bias voltage, to the electro-absorption type optical modulator. The temperature detection unit detects the ambient temperature of the semiconductor laser and the electro-absorption type optical modulator. The drive control unit controls the drive current supplied by the laser drive unit and the drive voltage applied by the optical modulator drive unit, based on the temperature detected by the temperature detection unit, so that average power, an extinction ratio and an optical cross point of the optical signal output from the semiconductor laser module are constant.

In the drive circuit of this configuration, a temperature in the semiconductor laser module is detected by the temperature detection unit. Based on this detection result, the drive current supplied to the semiconductor laser is controlled by the laser drive unit, and at the same time, the drive voltage applied to the electro-absorption type optical modulator is controlled by the optical modulator drive unit. Thus, differently from the conventional technique, without the need of controlling the temperature of the module to be constant by a Peltier device or the like, the optical signal having constant average power, a constant extinction ratio and a constant cross point is output from the semiconductor laser module. In this way, it becomes possible to obtain an optical output stable to a temperature change.

Further, the above drive circuit may be configured to include a photocurrent detection unit detecting a photocurrent generated as a result that the carrier light is absorbed by the electro-absorption type optical modulator, so that the drive current supplied by the laser drive unit and the drive voltage applied by the optical modulator drive unit are controlled by a drive control unit based on the temperature detected by the temperature detection unit and the photocurrent detected by the photocurrent detection unit, so as to hold the average power, the extinction ratio and the cross point of the optical signal output from the semiconductor laser module to be constant.

With this configuration, the drive current of the semiconductor laser and the drive voltage of the electro-absorption type optical modulator are controlled according to a change in the photocurrent generated in the electro-absorption type optical modulator as well as the temperature change in the semiconductor laser module. Thus, it becomes to make the optical signal output from the semiconductor laser module more stable.

The above and other objects, features and advantages will be made apparent from the detailed description below in conjunction with the accompanying drawings.

DESCRIPTION OF THE PREFERRED EMBODIMENTS

Embodiments of the present invention will be described below with reference to the drawings.

Figure 1:
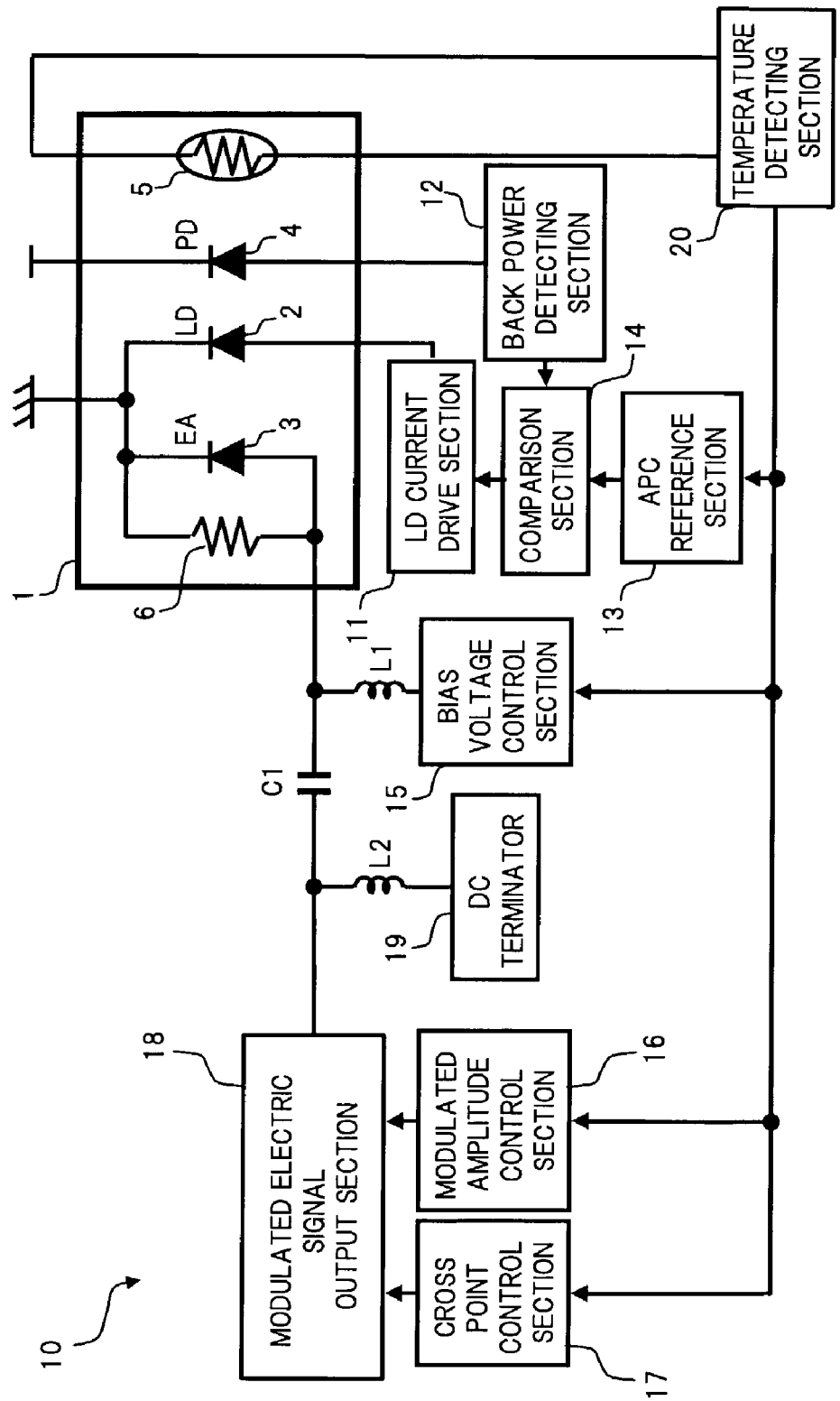
FIG. 1 is a functional block diagram showing a configuration of a first embodiment of a drive circuit of a semiconductor laser module according to the present invention.

FIG. 1 is a functional block diagram showing a configuration of a first embodiment of a drive circuit for a semiconductor laser module according to the present invention.

In FIG. 1, a semiconductor laser module 1 driven by a drive circuit 10 has a structure in which a semiconductor laser (LD) 2 as a light emitting element and an EA modulator 3 made of a semiconductor chip are integrated with each other. The semiconductor laser 2 generates carrier light (fixed light) of intensity corresponding to a drive current supplied by the drive circuit 10. In this carrier light, forward emission light emitted from the front end face of the semiconductor laser 2 is input to the EA modulator 3, and backward emission light emitted from the rear end face of the semiconductor laser 2 is input to a monitor photodiode (PD) 4 disposed in the module. A thermistor 5 disposed in the module is a temperature detecting element having a resistance value being changed according to the ambient temperature of the semiconductor laser 2 and the EA modulator 3.

The EA modulator 3 absorbs the carrier light according to the drive voltage applied by the drive circuit 10 to output intensity-modulated optical signals. The EA modulator 3 has a characteristic to supply a photocurrent corresponding to absorbance. Each cathode terminal of the semiconductor laser 2 and the EA modulator 3 is connected to a package of the semiconductor laser module 1, and here, has the earth potential. A resistor 6 electrically connected in parallel to the EA modulator 3 is a terminal resistor for generating a voltage to be applied to the EA modulator 3 based on a signal supplied from the drive circuit 10. An impedance value of the terminal resistor 6 to a microwave suitable for fast modulation is 50Ω, for example. Although not shown in the figure, the optical signals output from the EA modulator 3 are focused by a lens and coupled to an optical fiber, to thereby become an optical output from the semiconductor laser module 1.

The drive circuit 10 comprises, for example, as a configuration to drive control the semiconductor laser 2, an LD current drive section 11, a back power detecting section 12, an APC reference section 13 and a comparison section 14, and also comprises, as a configuration to drive control the EA modulator 3, a bias voltage control section 15, a modulated amplitude control section 16, a cross point control section 17, a modulated electric signal output section 18 and a DC terminator 19. The drive circuit 10 further comprises a temperature detecting section 20 detecting a temperature in the semiconductor laser module 1 according to a resistance value of the thermistor 5. A signal indicating this detection result at the temperature detecting section 20 is output to the APC reference section 13, the bias voltage control section 15, the modulated amplitude control section 16 and the cross point control section 17, respectively.

The LD current drive unit 10 generates a drive current to be supplied to the semiconductor laser 2. This drive current is controlled according to an output voltage of the comparison section 14 comparing an output voltage of the back power detecting section 12 with an output voltage of the APC reference section 13. The back power detecting section 12 converts a current flowing through the monitor PD 4 into a voltage according to the backward emission light of the semiconductor laser 2 to generate an output voltage corresponding to power of the backward emission light. Here, since a ratio between an optical output from the front end face and an optical output from the rear end face of the semiconductor laser 2 is constant, forward emission light power of the semiconductor laser 2 is detected indirectly by detecting the backward emission light power thereof.

The APC reference section 13 is for outputting a reference voltage for an optical output power control loop of the semiconductor laser 2. The reference voltage set by the APC reference section 13 is controlled according to an output signal from the temperature detecting section 20, as described later. The comparison section 14 compares the output voltage of the back power detecting section 12 and the output voltage of the APC reference section 13 with each other, and outputs a voltage corresponding to a difference between those output voltages to the LD current drive section 11.

The bias voltage control section 15 generates a bias voltage to be applied to the EA modulator 3 through an inductor L1. This bias voltage is controlled according to the output signal from the temperature detecting section 20. Impedance in an output portion of the bias voltage control section 15 is sufficiently high relative to a modulated signal band so that a modulated electric signal to be applied to the EA modulator 3 through a capacitor C1 from the modulated electric signal output section 18 may not flow into the bias voltage control section 15.

The modulated amplitude control section 16 outputs to the modulated electric signal output section 18, a signal for controlling amplitude of the modulated electric signal to be applied to the EA modulator 3. The setting of modulated amplitude controlled by the modulated amplitude control section 16 is controlled according to the output signal from the temperature detecting section 20. The cross point control section 17 outputs to the modulated electric signal output section 18, a signal for controlling a cross point of the modulated electric signal to be applied to the EA modulator 3. The setting of electric cross point controlled by the cross point control section 17 is also controlled according to the output signal from the temperature detecting section 20.

The modulated electric signal output section 18 generates a modulated electric signal having an amplitude and a cross point corresponding to the control signals from the modulated amplitude control section 16 and the cross point control section 17, and applies the modulated electric signal thus generated to the EA modulator 3 through the capacitor C1. The DC terminator 19 is a DC terminal of the modulated electric signal output section 18. Impedance of an output portion of the DC terminator 19 is also sufficiently high relative to the modulated signal band so that the modulated electric signal may not flow into the DC terminator 19.

Next, the description will be given of an operation of the drive circuit for the semiconductor laser module according to the first embodiment.

In the semiconductor laser module 1 having the EA modulator described above but without a Peltier device, the carrier light is generated in the semiconductor laser 2 in accordance with the drive current supplied from the drive circuit 10 to be input to the EA modulator 3. The carrier light is absorbed by the EA modulator 3 according to the voltage applied from the drive circuit 10 so that intensity-modulated optical signals are output from the EA modulator 3. The ambient temperature of the semiconductor laser 2 and the EA modulator 3 driven by the drive circuit 10 in this way is detected by the temperature detecting section 20 according to the resistance value of the thermistor 5 in the module. A signal corresponding to the temperature thus detected by the temperature detecting section 20 is output from the temperature detecting section 20 to the APC reference section 13, the bias voltage control section 15, the modulated amplitude control section 16 and the cross point control section 17, respectively.

On the driving side of the semiconductor laser 2 in the drive circuit 10, the output voltage of the APC reference section 13 being the reference voltage of the optical output power control loop is changed in accordance with the output signal from the temperature detecting section 20, and this output voltage is applied to one of input terminals of the comparison section 14. The other input terminal of the comparison section 14 is applied with the output voltage of the back power detecting section 12 corresponding to the backward emission light power of the semiconductor laser 2. Thus, a difference of the output voltage from the back power detecting section 12 from the reference voltage from the APC reference section 13 is obtained, and an output voltage corresponding to the difference is applied to the LD current drive section 11. In the LD current drive section 11, a setting value of the drive current to be supplied to the EA modulator 3 from the semiconductor laser 2 is adjusted in accordance with the output voltage from the comparison section 14 so that the output voltage of the back power detecting section 12 coincides with the reference voltage. As a result, carrier light power applied from the semiconductor laser 2 to the EA modulator 3 is feedback controlled to be constant regardless of a temperature change in the module.

On the driving side of the EA modulator 3 in the drive circuit 10, on the other hand, an output voltage of the bias voltage control section 15 is controlled in accordance with the output signal from the temperature detecting section 20, thereby optimizing a DC component (bias voltage) of the voltage to be applied to the EA modulator 3. Also, output voltages of the modulated amplitude control section 16 and the cross point control section 17 are controlled, thereby optimizing the amplitude and cross point of the modulated electric signal being an AC component of the voltage to be applied to the EA modulator 3.

A method of controlling the voltage to be applied to the EA modulator 3 according to the temperature change in the module will be explained with reference to FIG. 2.

Figure 2:
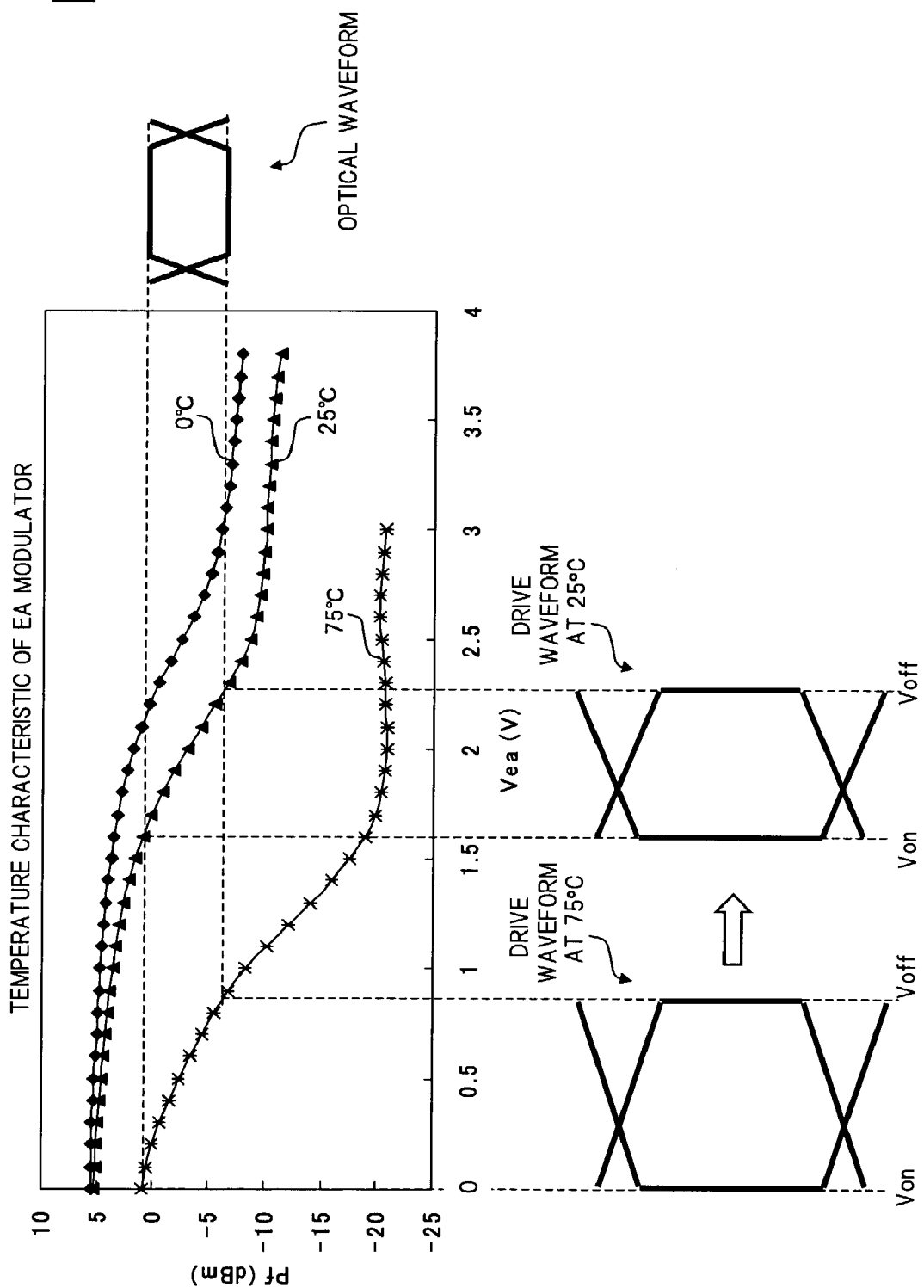
FIG. 2 is a diagram for explaining a method of controlling an applied voltage to an EA modulator in the first embodiment.
Figure 16:
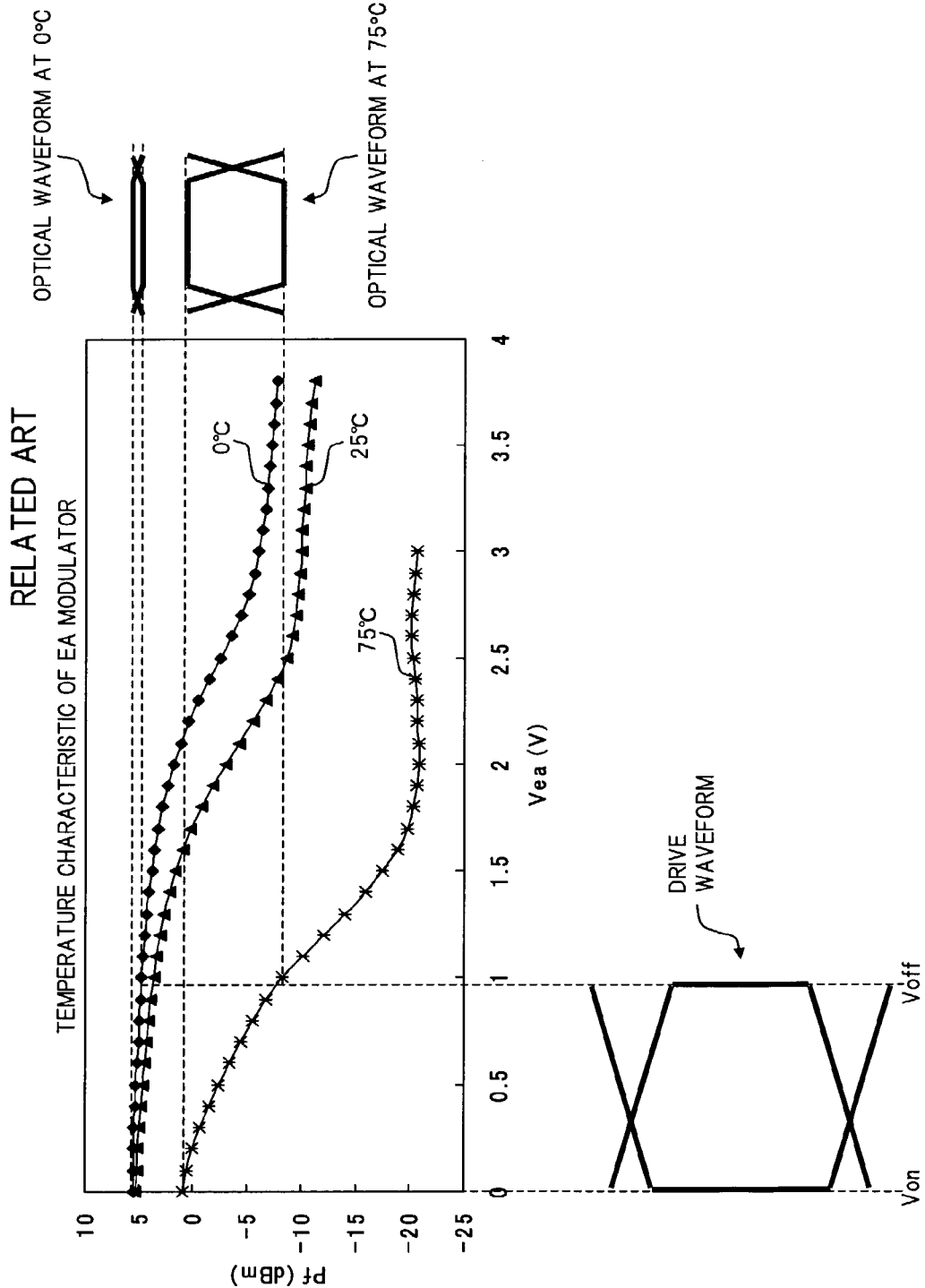
FIG. 16 is a diagram showing temperature dependence of operating characteristics of a typical EA modulator.

An example in FIG. 2 schematically shows a state of controlling the voltage to be applied to the EA modulator 3 having a temperature characteristic similar to that of the typical EA modulator shown in FIG. 16 in the case where the temperature detected by the temperature detecting section 20 is changed from 75° C. to 25° C. Namely, in the case where the temperature detected by the temperature detecting section 20 is 75° C., an average voltage level (bias voltage) of an applied voltage Vea to the EA modulator 3 is set so that a low level (Von) and a high level (Voff) of the modulated electric signal are changed in a range of about 0V to 0.8V, as shown in the lower left side of FIG. 2, corresponding to a region where a curve indicating the temperature characteristic of the EA modulator 3 has a large inclination and is changed substantially linearly. At this time, the amplitude and cross point of the modulated electric signal are set, respectively, so that a desired extinction ratio and a desired optical cross point (optical waveform duty) can be obtained according to inclination and distortion of the characteristic curve in a driving region. By supplying the applied voltage having such a drive waveform to the EA modulator 3, an optical signal having a waveform as shown on the upper right side of FIG. 2 is output from the EA modulator 3.

In the case where the temperature detected by the temperature detecting section 20 is 25° C., on the other hand, as shown in the lower central part of FIG. 2, the bias voltage of the EA modulator 3 is shifted to a high level according to a change in the characteristic curve of the EA modulator 3, and at the same time, the amplitude and cross point of the modulated electric signal are adjusted so that the desired extinction ratio and the desired optical cross point can be obtained according to changes in the inclination and distortion of the characteristic curve. As a result, as shown in the upper right part of FIG. 2, in the case of the temperature of 25° C., the EA modulator 3 outputs an optical signal having the same average output power and waveform as those in the optical signal in the case of the temperature of 75° C. Although not shown in the figure, also in the case where the detected temperature is 0° C., the drive voltage in which the bias voltage, the modulated amplitude and the electric cross point are optimized according to the characteristic curve for 0° C. in the same manner as the above, is applied to the EA modulator 3, so that an optical signal similar to those in the cases of the detection temperatures of 75° C. and 25° C. is output from the EA modulator 3.

As described above, the drive current of the semiconductor laser 2 and the drive voltage (the bias voltage, the modulated amplitude and the electrical cross point) of the EA modulator 3 are controlled according to the temperature detected by the temperature detecting section 20. Thus, it becomes possible to control the average output power, the extinction ratio and the optical cross point of the optical signal output from the semiconductor laser module 1 to be constant, independently of the ambient temperature, without controlling the temperature of the module with a Peltier device or the like.

Now, a specific example of the configuration of the drive circuit 10 shown in FIG. 1 will be described. The configuration of the drive circuit according to this invention, however, is not limited to the example described below.

Figure 3:
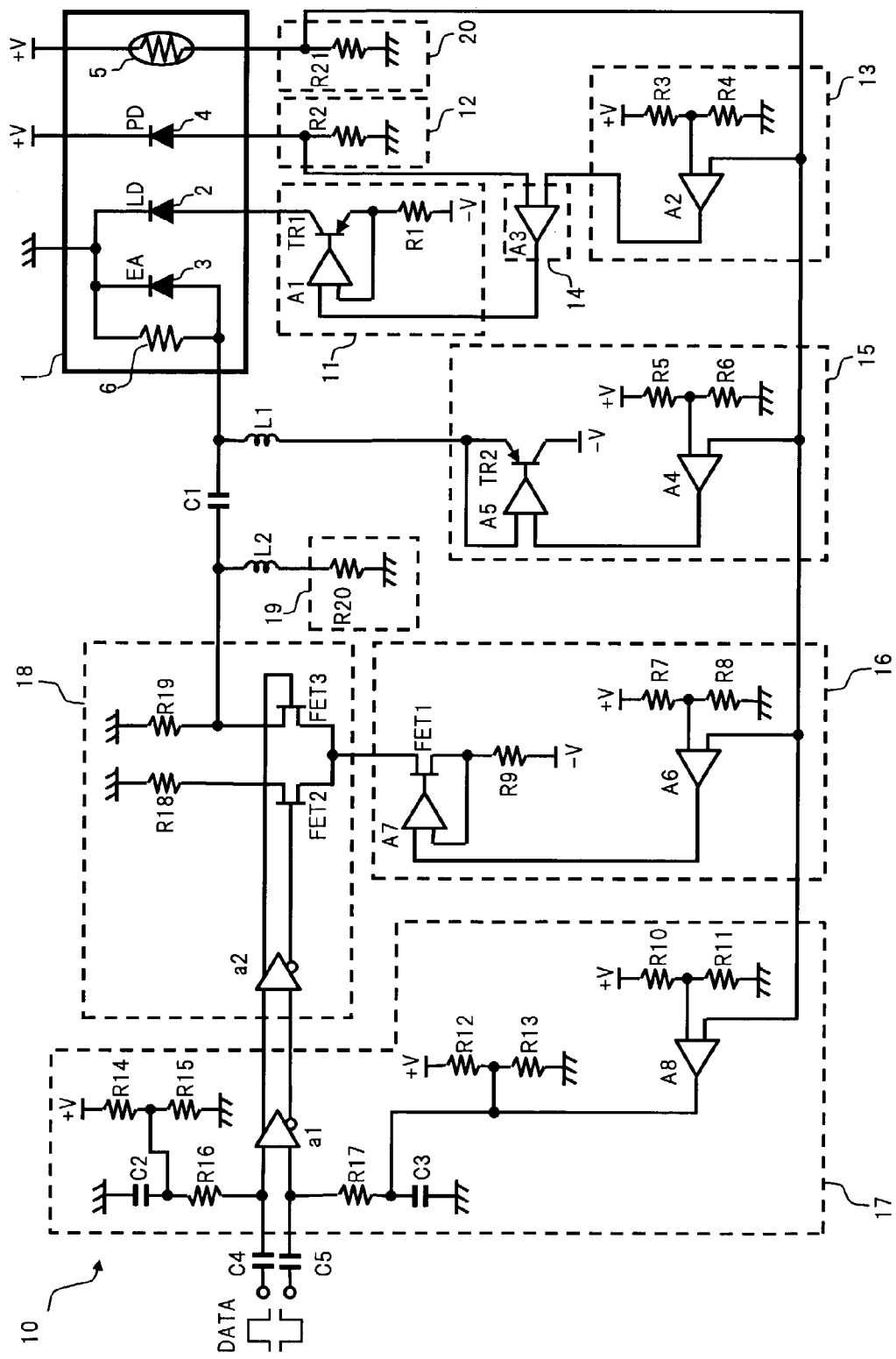
FIG. 3 is a circuit diagram showing a specific example of the first embodiment.

FIG. 3 is a circuit diagram showing a specific example of the drive circuit 10 shown in FIG. 1.

In the configuration example of FIG. 3, the LD current drive section 11 comprises a transistor TR1 with a collector terminal thereof connected to an anode terminal of the semiconductor laser 2 and an emitter terminal thereof connected through a resistor R1 to a negative supply voltage (−V) terminal, and a differential amplifier A1 that is applied with the emitter voltage of the transistor TR1 at one input terminal thereof to apply an output voltage thereof to a base terminal of the transistor TR1. The back power detecting section 12 comprises a resistor R2 with one end thereof connected to the monitor photodiode 4 of the semiconductor laser module 1 and the other end thereof grounded.

The APC reference section 13 comprises resistors R3, R4 connected in series between a positive supply voltage (+V) terminal and an earth terminal, and a differential amplifier A2 with one input terminal thereof applied with a voltage at a connection between the resistors R3, R4 and the other input terminal thereof applied with the output signal of the temperature detecting section 20. The temperature detecting section 20 comprises a resistor R21 with one end thereof connected to the thermistor 5 and the other end thereof grounded. The comparison section 14 comprises a differential amplifier A3 with one input terminal thereof applied with a voltage at a connection between the monitor photodiode 4 and the resistor R2 and the other input terminal thereof applied with an output voltage of the differential amplifier A2.

The bias voltage control section 15 comprises, here, resistors R5, R6, differential amplifiers A4, A5 and a transistor TR2. The resistors R5, R6 are connected in series between the positive supply voltage terminal and the earth terminal. The differential amplifier A4 is applied with a voltage at a connection between the resistors R5, R6 at one input terminal thereof and is applied with the output signal of the temperature detecting section 20 at the other input terminal thereof. The transistor TR2 has an emitter terminal connected to the anode terminal of the EA modulator 3 through an inductor L1 and a collector terminal connected to the negative supply voltage terminal. The differential amplifier A5 is applied with an output voltage of the differential amplifier A4 at one input terminal thereof and is applied with an emitter voltage of the transistor TR2 at the other input terminal thereof, to apply an output voltage a base terminal of the transistor TR2.

The amplitude modulation control unit 16 comprises, here, resistors R7 to R9, differential amplifiers A6, A7 and a field effect transistor FET1. The resistors R7, R8 are connected in series between the positive supply voltage terminal and the earth terminal. The differential amplifier A6 is applied with a voltage at a connection between the resistors R7, R8 at one input terminal thereof and is applied with the output signal of the temperature detecting section 20 at the other input terminal thereof. The field effect transistor FET1 is connected between one end of the resistor R9 and source terminals of field effect transistors FET2, FET3 constituting a differential pair of the modulated electric signal output section 18 described later, to operate as a current source. The other end of the resistor R9 is connected to the negative supply voltage terminal. The differential amplifier A7 is applied with a voltage at a connection between the field effect transistor FET1 and the resistor R9 at one input terminal thereof and is applied with an output voltage of the differential amplifier A6 at the other input terminal thereof, to apply an output voltage to a gate terminal of the field effect transistor FET1.

The cross point control section 17 comprises, here, resistors R10 to R17, a differential amplifier A8, an amplifier a1 and capacitors C2, C3. The resistors R10, R11 are connected in series between the positive supply voltage terminal and the earth terminal, and the resistors R12, R13 and the resistors R14, R15, are similarly connected in series between the positive supply voltage terminal and the earth terminal. The differential amplifier A8 is applied with a voltage at a connection between the resistors R10, R11 at one input terminal thereof, and is applied with the output signal of the temperature detecting section 20 at the other input terminal thereof. The amplifier a1 is for amplifying, up to required levels, a data signal and an inverted data signal applied to input terminals thereof through capacitors C4, C5, to output the amplified data signals, and each end of the resistors R16, R17 is connected between each input terminal of the amplifier a1 and the capacitors C4, C5, respectively. Each of the other terminals of the resistors R16, R17 is grounded through the capacitors C2, C3, respectively. A voltage at a connection between the resistors R14, R15 is applied to a connection between the resistor R16 and the capacitor C2, while a voltage at a connection between the resistors R12, R13 and an output voltage of the differential amplifier A8 are applied to a connection between the resistor R17 and the capacitor C3.

The modulated electric signal output section 18 comprises an amplifier a2, the field effect transistors FET1, FET2 described above and resistors R18, R19. The amplifier a2 amplifies an output signal from the amplifier a1 up to a required level, and applies an inverted output signal to a gate terminal of the field effect transistor FET2, and a non-inverted output signal to a gate terminal of the field effect transistor FET3. The resistor R18 has one terminal connected to a drain terminal of the field effect transistor FET2, and the resistor R19 has one terminal connected to a drain terminal of the field effect transistors FET3, and the other terminal thereof are grounded, respectively. Here, a voltage at a connection between the drain terminal of the field effect transistor FET3 and the resistor R19 is applied to the anode terminal of the EA modulator 3 through the capacitor C1. The DC terminator 19 comprises a resistor R20 having one end connected to a signal line between the drain terminal of the field effect transistor FET3 and the capacitor C1 through an inductor L2, and the other end grounded.

In the drive circuit 10 having such a specific configuration as described above, a voltage value at one end of the resistor R21 is changed according to a change in the resistance value of the thermistor 5, so that the temperature change in the semiconductor laser module 1 is detected. This voltage value is transmitted as the output signal of the temperature detecting section 20 to the APC reference section 13, the bias voltage control section 15, the modulated amplitude control section 16 and the cross point control section 17.

In the APC reference section 13, a difference between the output voltage of the temperature detecting section 20 and the reference voltage set in accordance with the resistors R3, R4, is obtained by the differential amplifier A2, and the resultant differential voltage is multiplied by a multiplying factor, to be output to the differential amplifier A3. The differential amplifier A3 compares the detection result of the back power detecting section 12 with the output voltage of the differential amplifier A2 as a reference. According to the result of this comparison, a base voltage of the transistor TR1 of the LD current drive section 11 is regulated, so that the drive current of the semiconductor laser 2 is feedback controlled.

In the bias voltage control section 15, a difference between the output voltage of the temperature detecting section 20 and the reference voltage set in accordance with the resistors R5, R6, is obtained by the differential amplifier A4. The resultant differential voltage is multiplied by a desired multiplying factor, and thereafter supplied to the differential amplifier A5 so that a base voltage of the transistor TR2 is regulated. Thus, the bias voltage of the EA modulator 3 is controlled according to the temperature change. In the modulated amplitude control section 16, a difference between the output voltage of the temperature detecting section 20 and the reference voltage set in accordance with the resistors R7, R8 is obtained by the differential amplifier A6. The resultant differential voltage is multiplied by a desired multiplying factor, and thereafter supplied to the differential amplifier A7 so that a gate voltage of the field effect transistor FET1 is regulated. Thus, the amplitude of the modulated electric signal output from the modulated electric signal output section 18 is controlled according to the temperature change. Further, in the cross point control section 17, a difference between the output voltage of the temperature detecting section 20 and the reference voltage set in accordance with the resistors R10, R11, is obtained by the differential amplifier A8. The resultant differential voltage is multiplied by a desired multiplying factor, and thereafter supplied to the connection between the resistor R17 and the capacitor C3, so that the cross point of the modulated electric signal is controlled according to the temperature change.

As described above, according to the specific example of the drive circuit 10 shown in FIG. 3, the drive current of the semiconductor laser 2 and the drive voltage of the EA modulator 3 can be controlled linearly with respect to the output signal of the temperature detecting section 20.

Figure 4:
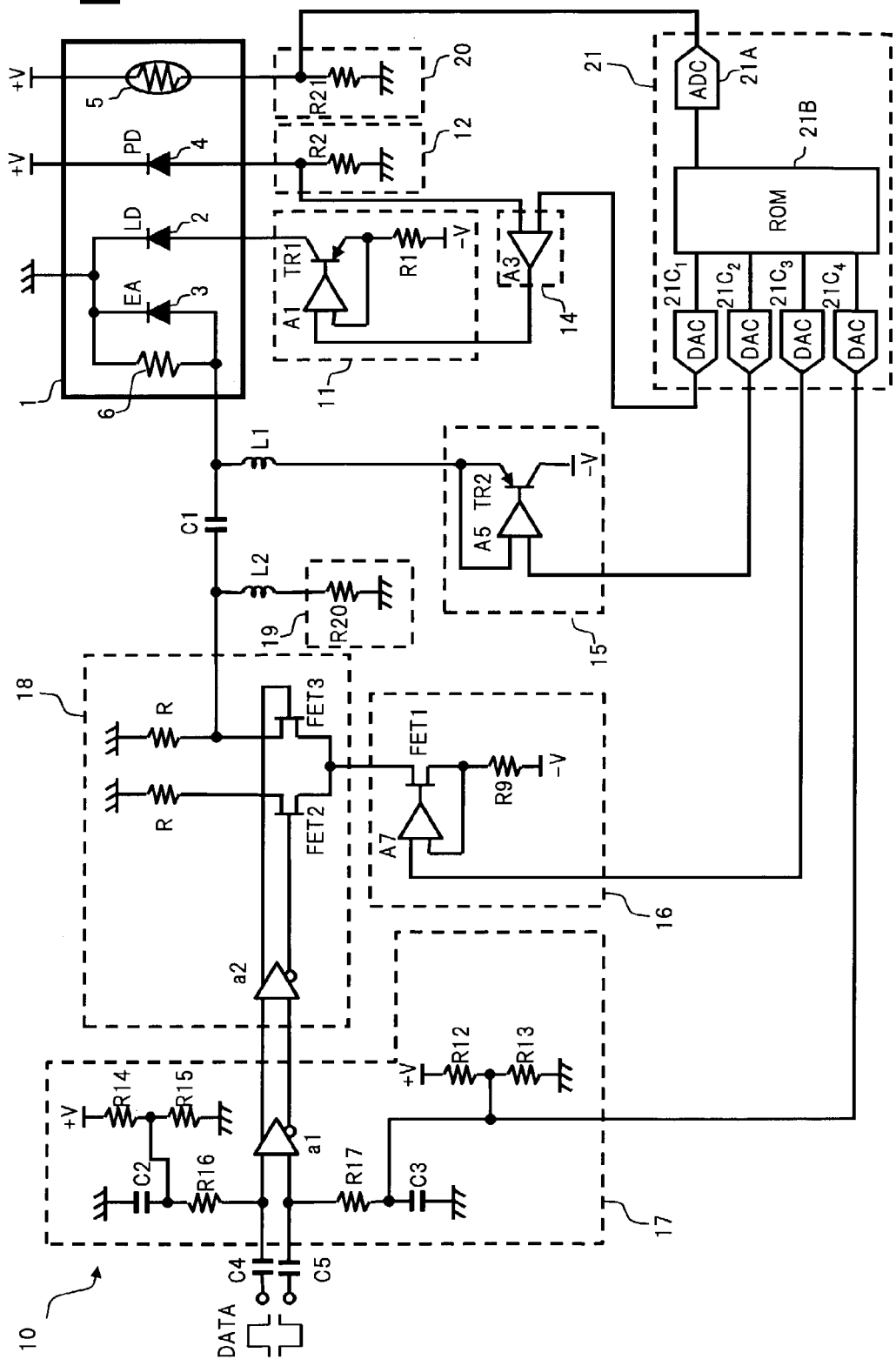
FIG. 4 is a circuit diagram showing another specific example of the first embodiment.

FIG. 4 is a circuit diagram showing another specific example of the drive circuit 10 of FIG. 1. The components same as those of the configuration example shown in FIG. 3 are denoted by the same reference numerals, and the description thereof is omitted.

The configuration example shown in FIG. 4 is characterized to use a control LSI 21 provided with an analog-to-digital converter (ADC) 21A, a ROM 21B and digital-to-analog converters (DAC) $21C_1$ to $21C_4$, to control the drive current of the semiconductor laser 2 and the drive voltage of the EA modulator 3.

In this control LSI 21, first, an analog voltage value corresponding to the resistance value of the thermistor 5 output from the temperature detecting section 20 is converted into a digital value by the ADC 21A. Then, in accordance with this digital value, addressing of a table stored in the ROM 21B is performed, and a set value of each address is read out to be output to the corresponding DACs $21C_1$ to $21C_4$, respectively. In each DAC, an analog voltage signal corresponding to the set value from the ROM 21B is generated. Specifically, an output signal of the DAC $21C_1$ corresponding to the control of the drive current of the semiconductor laser 2 is supplied as the reference voltage in the differential amplifier A3 of the comparison section 14. Also, an output signal of the DAC $21C_2$ corresponding to the control of the bias voltage of the EA modulator 3 is supplied as the reference voltage in the differential amplifier A5 of the bias voltage control section 15, and an output signal of the DAC $21C_3$ corresponding to the control of the amplitude of the modulated electric signal is supplied as the reference voltage in the differential amplifier A7 of the modulated amplitude control section 16. Further, an output signal of the DAC $21C_4$ corresponding to the control of the cross point of the modulated electric signal is supplied to the connection between the capacitor C3 and the resistor R17 of the cross point control section 17.

Figure 5:
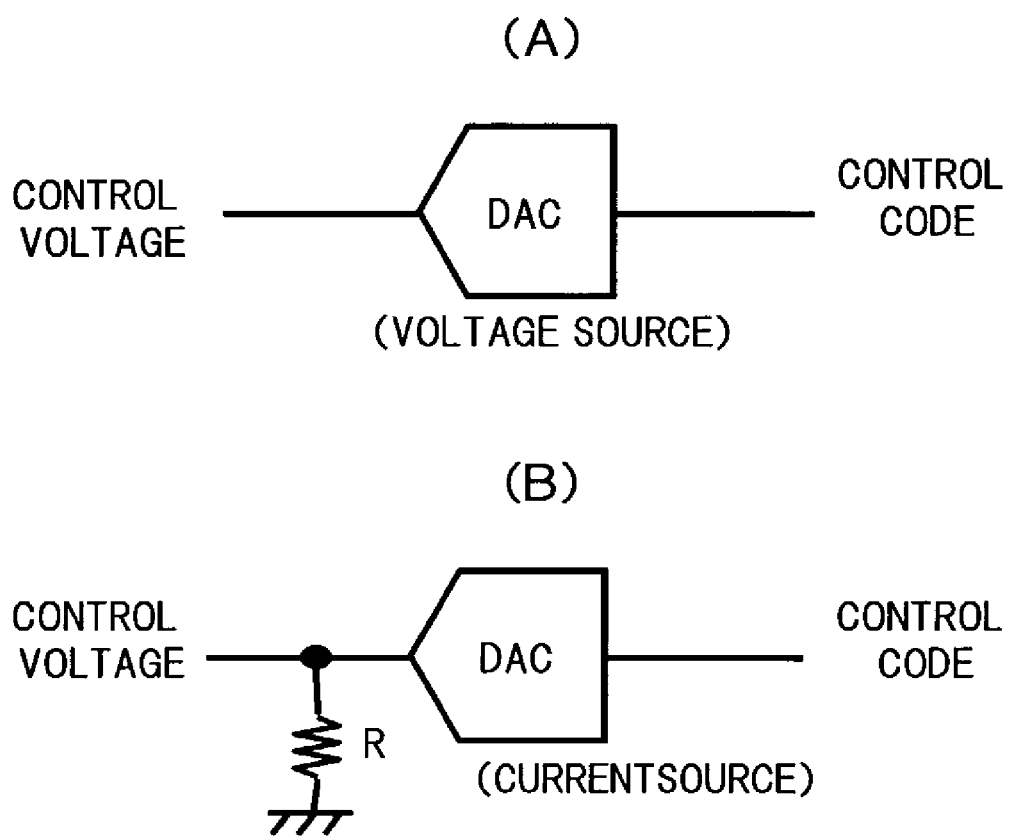
FIG. 5 is a diagram showing specific examples of a DAC shown in FIG. 4.

In the control LSI 21, if the DACs $21C_1$ to $21C_4$ outputs a voltage source output as shown in (A) of FIG. 5, for example, a control voltage output from each of the DACs $21C_1$ to $21C_4$ can be supplied as it is to each corresponding control unit. On the other hand, if the DACs $21C_1$ to $21C_4$ outputs a current source output as shown in (B) of FIG. 5, the control voltage to be supplied to each control unit may be obtained by connecting a resistor for voltage conversion to an output side of each DAC.

Figure 6:
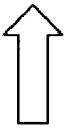
FIG. 6 is a diagram showing a specific example of a table stored in a ROM shown in FIG. 4.

FIG. 6 shows a specific example of the table stored in the ROM 21B.

As illustrated in FIG. 6, in the ROM table, there is recorded an appropriate set value (a value expressed in hexadecimal notation in this case) for each of the DACs $21C_1$ to $21C_4$ at each address corresponding to each digital value converted from the output voltage of the temperature detecting section 20 by the ADC 21A. For this set value in the ROM table, an optimum value is determined in advance for each control by measuring a characteristic change in the semiconductor laser module 1 at each temperature. Also, in the case where temperature characteristic data of the semiconductor laser module 1 can be obtained for the setting of required temperatures (for example, 0° C., 25° C. and 75° C.), set values for other than the above-mentioned temperatures can be obtained by a complement using an approximate expression based on such data.

Figure 7:
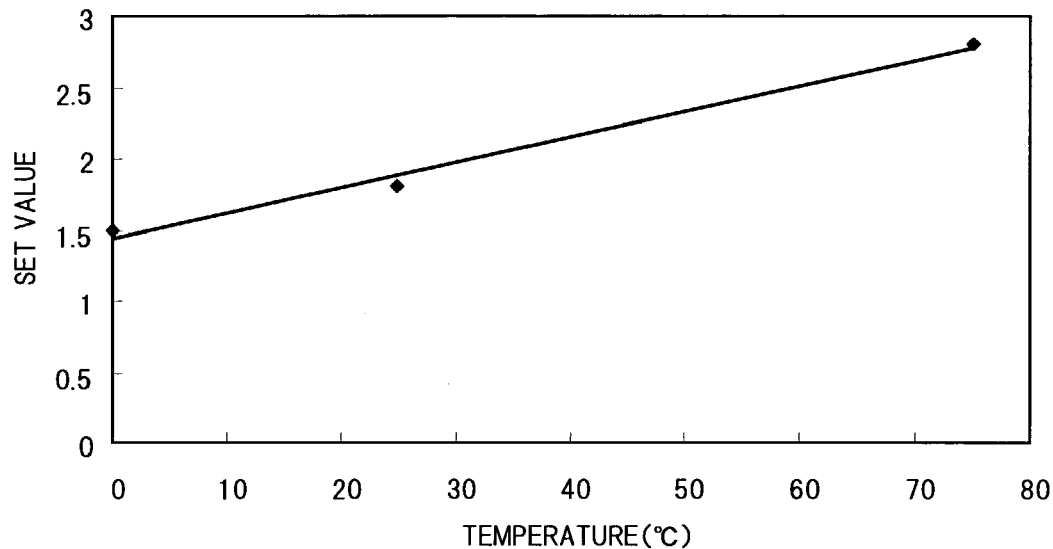
FIG. 7 is a graph showing an example in which a set value in the ROM table is obtained by a complement using a linear approximate expression.
Figure 8:
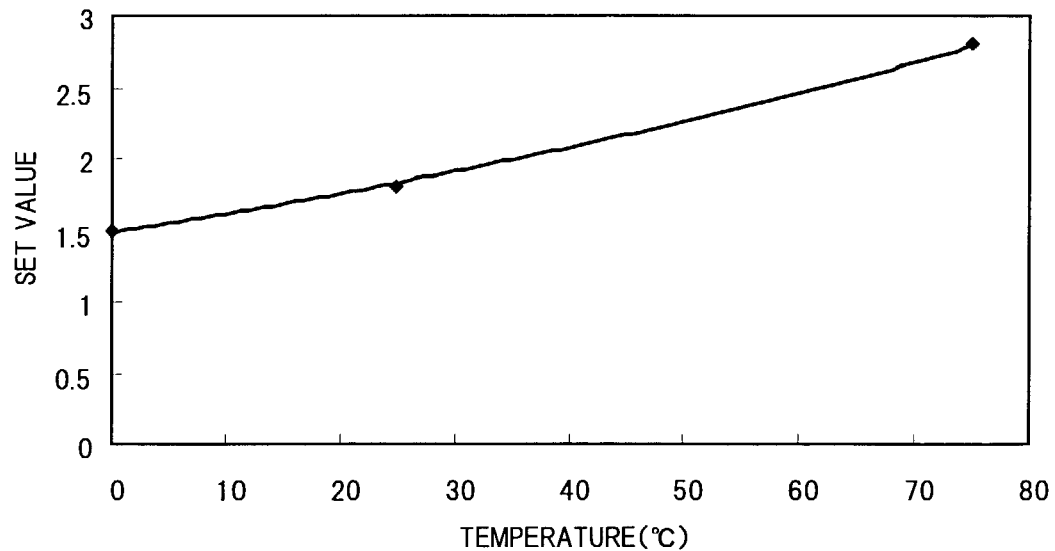
FIG. 8 is a graph showing an example in which the set value in the ROM table is obtained by a complement using an exponential approximate expression.
Figure 9:
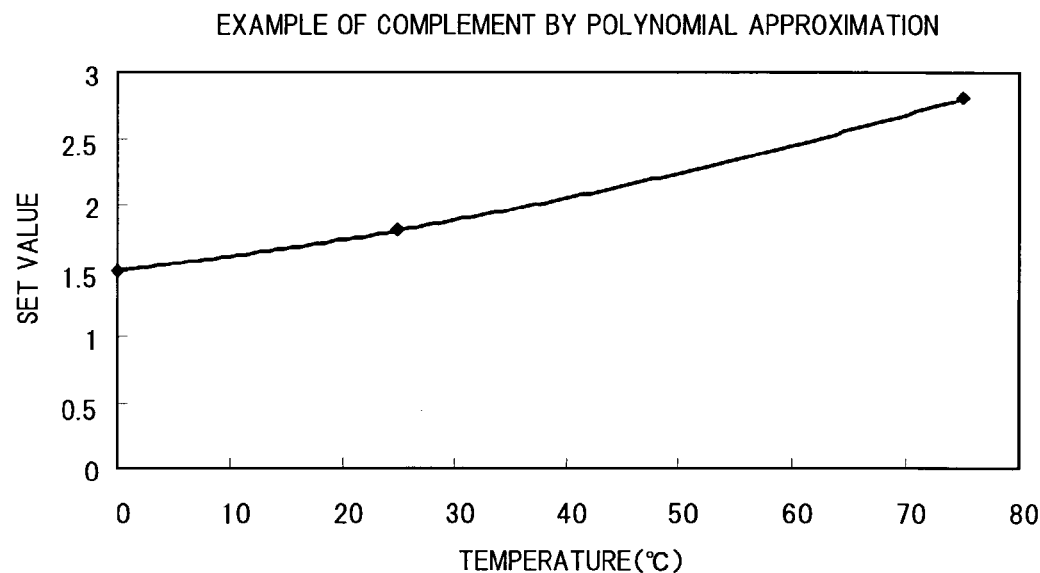
FIG. 9 is a graph showing an example in which the set value in the ROM table is obtained by a complement using a polynomial approximate expression.
Figure 10:
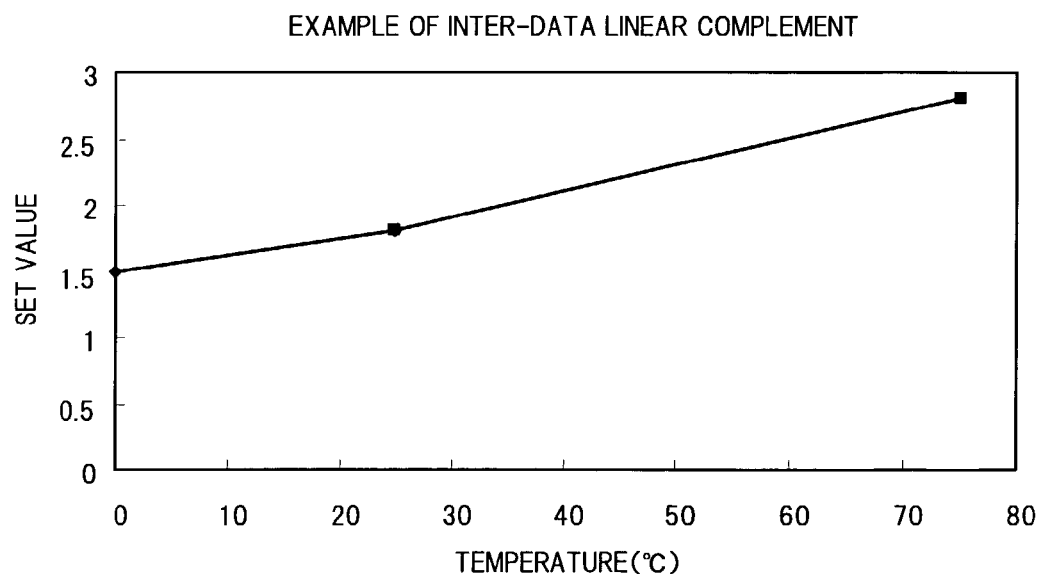
FIG. 10 is a graph showing an example in which the set value in the ROM table is obtained by a complement using an inter-data linear approximation.

For example, if the temperature characteristic data for three temperatures is obtained, assuming that T: temperature, and a, b, c, y: constants, it is possible to obtain a set value at a desired temperature T by a complement using a linear approximate expression=a·T+b as shown in FIG. 7, a complement using an exponential approximate expression=a·exp(b·T)+c as shown in FIG. 8, or a complement using a polynomial approximate expression=a·$x^y$+ b·$x^{y-1}$+ . . . +c as shown in FIG. 9. Also, as shown in FIG. 10, the characteristics of adjacent data may be individually complemented using the linear approximate expression.

Although the specific example of the complement has been shown for the case where the measurement points of the temperature characteristic data is three, the present invention is not limited thereto, but it becomes possible to obtain the set values with higher accuracy by using the data at many more measurement points. Also, it is possible to combine different complement methods by using, for example, the linear approximate expression for a given temperature range and the exponential approximate expression for another temperature range.

As described above, in the specific example of the drive circuit 10 shown in FIG. 4, the drive current of the semiconductor laser 2 and the drive voltage of the EA modulator 3 are controlled in accordance with the set values in the ROM table. Thus, it becomes possible to perform a nonlinear control of the output signal of the temperature detecting section 20 as well as the linear control.

In the specific example using the control LSI 21 described above, it is possible to adopt an application, for example, of a computation process by a CPU on a portion being controlled in analog by digitizing an input thereto.

Next, a second embodiment of the drive circuit for the semiconductor laser module according to the present invention will be described.

Figure 11:
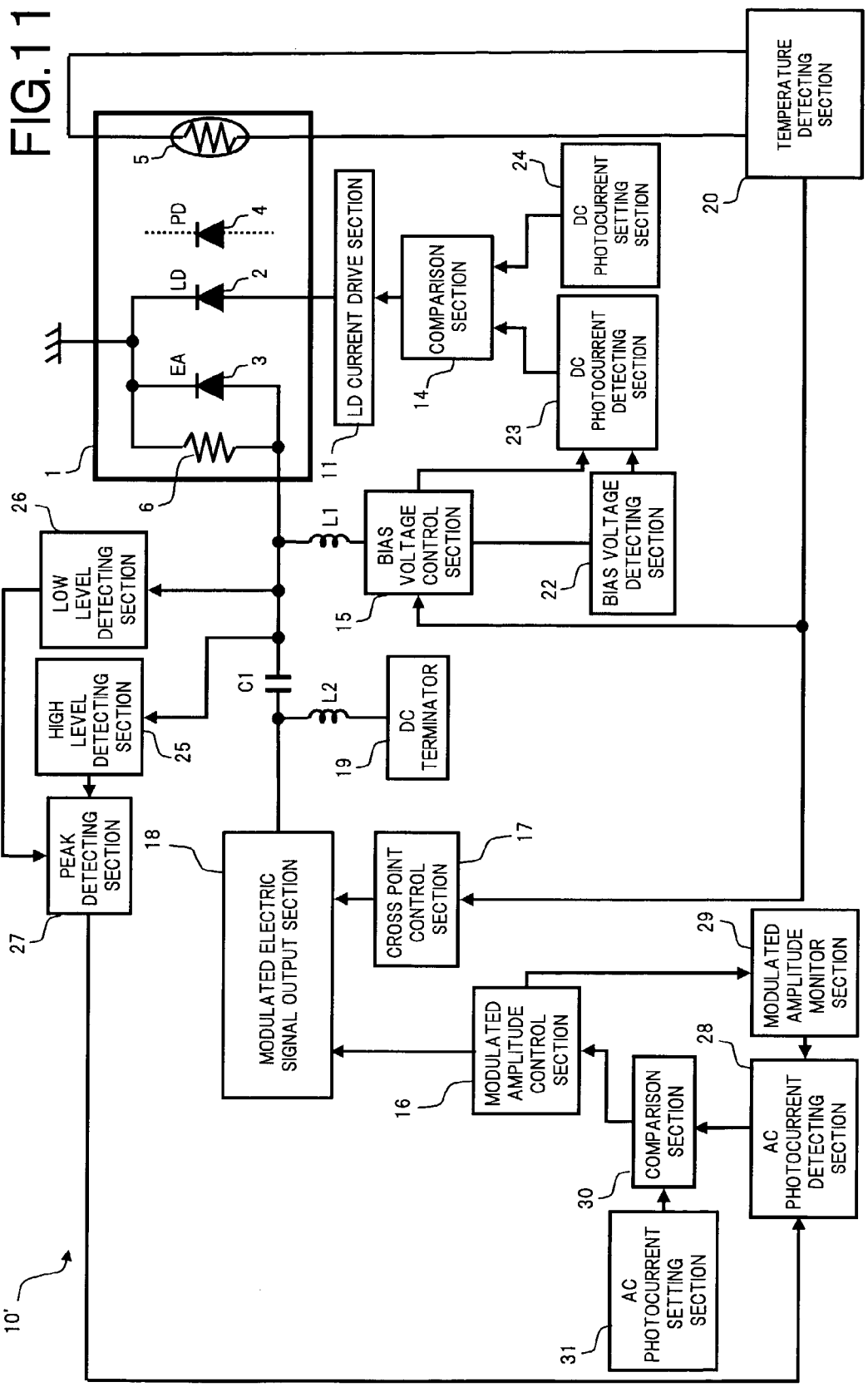
FIG. 11 is a functional block diagram showing a configuration of a second embodiment of a drive circuit of a semiconductor laser module according to the present invention.

FIG. 11 is a functional block diagram showing a configuration of the drive circuit for the semiconductor laser module in the second embodiment. The components same as those of the first embodiment are denoted by the same reference numerals, and the description thereof is omitted.

In FIG. 11, the configuration of the semiconductor laser module driven by a drive circuit 10' is basically the same as that of the first embodiment. In this second embodiment, instead of utilizing the monitor photodiode 4 in the semiconductor laser module 1 for controlling the optical output of the semiconductor laser 2 to be constant, detecting the photocurrent generated by the absorption of the carrier light in the EA modulator 3, and based on a change in the photocurrent, the drive current of the semiconductor laser 2 is controlled and at the same time the modulated amplitude of the applied voltage to the EA modulator is controlled. Therefore, in this embodiment, it is possible to use a semiconductor laser module that is not provided with the monitor photodiode 4.

Specifically, the drive circuit 10' comprises a bias current detecting section 22 detecting a DC current that is a combination of the photocurrent in the EA modulator 3 and the current flowing through the terminal resistor 6. The bias current detecting section 22 converts a detection value of this DC current into a voltage value for a load value of the terminal resistor 6, to output it to a DC photocurrent detecting section 23. The DC photocurrent detection section 23 compares an output voltage of the bias voltage control section 15 similar to that of the first embodiment with an output voltage of the bias current detecting section 22, and based on a comparison result, detects a DC component of the photocurrent flowing through the EA modulator 3, to output a voltage signal corresponding to a detected value to the comparison section 14.

The comparison section 14 that is supplied with an output voltage of a DC photocurrent setting section 24 generating a voltage corresponding to a set value of the DC component of the photocurrent at the time of operation of the semiconductor laser module 1, obtains a difference between an output voltages of the DC photocurrent detecting section 23 and the DC photocurrent setting section 24, to supply, to the LD current drive section 11, an output voltage multiplied by the difference.

Also, the drive circuit 10' comprises a high level detecting section 25 and a low level detecting section 26, detecting a high-level voltage and a low-level voltage, respectively, of the modulated electric signal to be applied to the EA modulator through the capacitor C1 from the modulated electric signal output section 18. The detection results at the high level detecting section 25 and the low level detecting section 26 are sent to a peak detecting section 27. The peak detecting section 27 obtains a difference between output voltages of the high level detecting section 25 and the low level detecting section 26, and detects the amplitude of the modulated electric signal applied to the EA modulator 3, to output a signal indicating the detection result to the AC photocurrent detecting section 28.

The AC photocurrent detecting section 28 that is supplied with an output voltage of the modulated amplitude monitor section 29 detecting the modulated amplitude set by the modulated amplitude control section 16 similar to that of the first embodiment, obtains a difference between an output voltage of the peak detecting section 27 and the output voltage of the modulated amplitude monitor section 29, and detects an AC component of the photocurrent flowing through the EA modulator 3, to output a voltage corresponding to that time to the comparison section 30.

The comparison section 30 that is supplied with an output voltage of the AC photocurrent setting section 31 generating a voltage corresponding to a set value of the AC component of the photocurrent at the time of operation of the semiconductor laser module 1, obtains a difference between output voltages of the AC photocurrent detecting section 28 and the AC photocurrent setting section 31, to supply an output voltage multiplied by the difference to the modulated amplitude control section 16.

The components other than the above described components of the drive circuit 10' in the second embodiment are similar to the corresponding components of the drive circuit 10 in the first embodiment.

A specific example of a configuration of the drive circuit 10' shown in FIG. 11 will be described. The present invention, however, is not limited to the example of the drive circuit described below.

Figure 12:
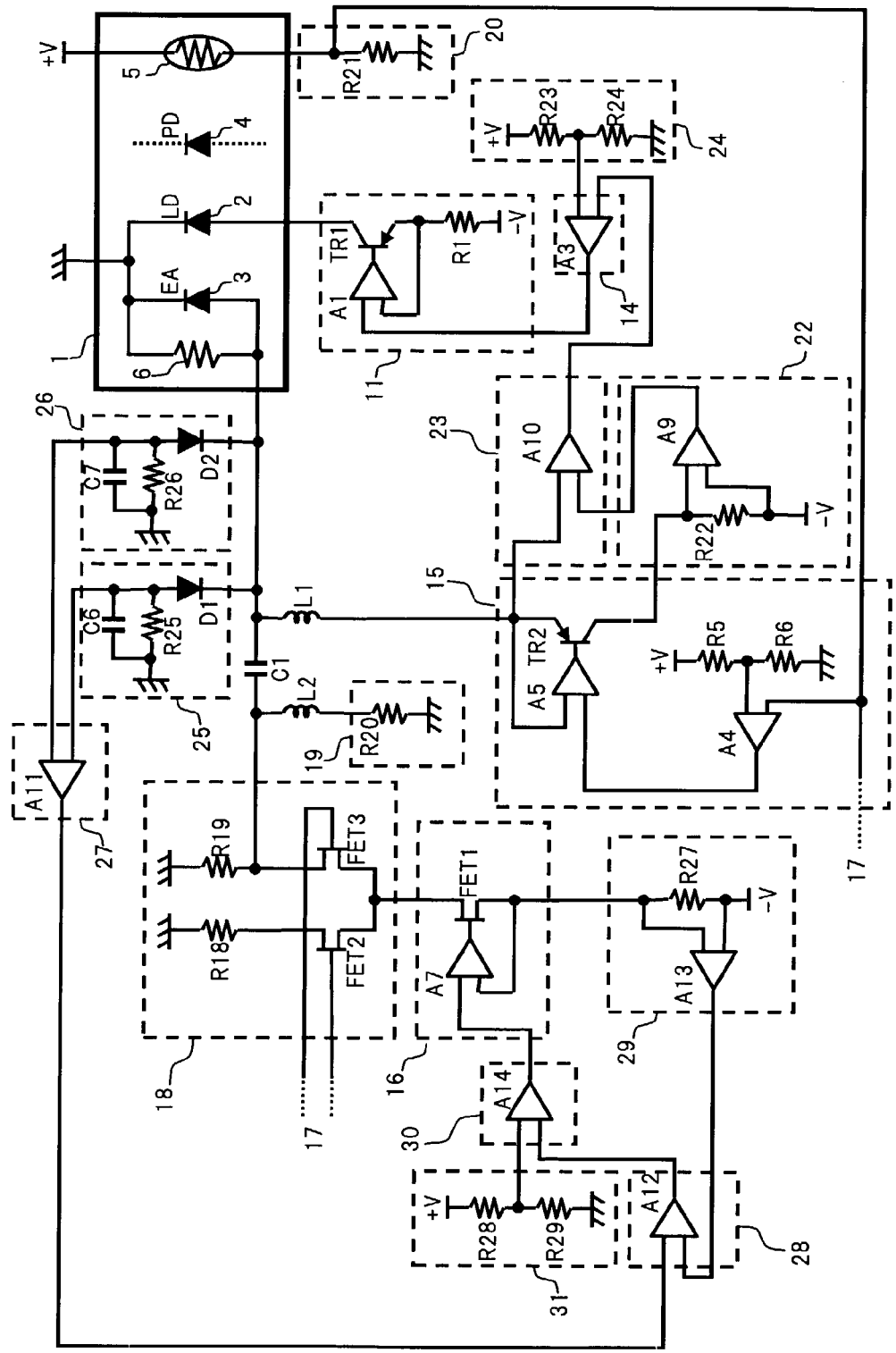
FIG. 12 is a circuit diagram showing a specific example of the second embodiment.

FIG. 12 is a circuit diagram showing the specific example of the drive circuit 10' described with reference to FIG. 11. The components the same as those in the configuration example of FIG. 3 are denoted by the same reference numerals, respectively, and the description thereof is omitted.

In the configuration example shown in FIG. 12, the bias current detecting section 22 comprises a resistor R22 inserted between the collector terminal of the transistor TR2 and the negative supply voltage (−V) terminal of the bias voltage control section 15, and a differential amplifier A9 applied with voltages across the resistor R22 at input terminals thereof. The DC photocurrent detecting section 23 comprises a differential amplifier A10 applied with the emitter voltage of the transistor TR2 of the bias voltage control section 15 at one input terminal thereof and an output voltage of the differential amplifier A9 of the bias current detecting section 22 at the other input terminal thereof. The DC photocurrent setting section 24 comprises resistors R23, R24 connected in series between the positive supply voltage (+V) terminal and the earth terminal. A voltage at a connection between the resistors R23, R24 is applied to the one input terminal of the differential amplifier A3 making up the comparison section 14. The other input terminal of the differential amplifier A3 of the comparison section 14 is applied with an output voltage of the differential amplifier A10 of the DC photocurrent detecting section 23.

The high level detecting section 25 comprises a diode D1, a resistor R25 and a capacitor C6. The diode D1 has a cathode terminal connected to the signal line connected to the anode terminal of the EA modulator 3, and an anode terminal connected to one input terminal of a differential amplifier A11 making up the peak detecting section 27. The resistor R25 and the capacitor C6 are connected in parallel between the anode terminal of the diode D1 and the earth terminal. The low level detecting section 26 has a similar configuration to the high level detecting section 25, and comprises a diode D2, a resistor R26 and a capacitor C7. An anode terminal of the diode D2 is connected to the other input terminal of the differential amplifier A11 of the peak detecting section 27.

The AC photocurrent detecting section 28 comprises a differential amplifier A12 applied with an output voltage of the differential amplifier A11 of the peak detecting section 27 at one input terminal thereof. The modulated amplitude monitor section 29 comprises a resistor R27 inserted between the source terminal of the FET1 of the modulated amplitude control section 16 and the negative supply voltage terminal, and a differential amplifier A13 applied with voltages across the resistor R27 at input terminals thereof. An output voltage of the differential amplifier A13 is applied to the other input terminal of the differential amplifier A12 of the AC photocurrent detecting section 28. The comparison section 30 comprises a differential amplifier A14 applied with an output voltage of the differential amplifier A12 of the AC photocurrent detecting section 28 at one input terminal thereof. The AC photocurrent setting section 31 comprises resistors R28, R29 connected in series between the positive supply voltage terminal and the earth terminal. A voltage at a connection between the resistors R28, R29 is applied to the other input terminal of the differential amplifier A14 of the comparison section 30. An output voltage of the differential amplifier A14 of the comparator 30 is applied to the differential amplifier A7 of the modulated amplitude control section 16.

Next, an operation of the second embodiment described above will be explained.

First, the description will be given of a control operation performed to maintain the power of the forward emission light of the semiconductor laser 2 to be constant according to the DC component of the photocurrent generated in the EA modulator 3.

In the optical output constant control of the semiconductor laser 2, the output voltage of the temperature detecting section 20 corresponding to the resistance value of the thermistor 5 is multiplied by the bias voltage control section 15, and the bias voltage to be applied to the EA modulator 3 is controlled with respect to the value of the multiplied voltage. Here, the bias voltage applied to the EA modulator 3 is expressed by Vbias.

A value Ibais of the current flowing into the bias voltage control section 15 at that time is a sum of the DC component Iphoto_dc of the photocurrent generated as a result that the carrier light is absorbed by the EA modulator 3 and a current Ir flowing through the terminal resistor 6. In the bias current detecting section 22, the current value Ibais is voltage converted by a monitor resistor or the like, to be detected, and the detection result is output to the DC photocurrent detecting section 23. An output voltage V22 of the bias current detecting section 22 is expressed by the following equation (1) with a voltage conversion gain as G22.

$$V22 = G22 \times (Ir + I\text{photo\_dc}) \quad (1)$$

In the DC photocurrent detecting section 23, a difference between the output voltage Vbias from the bias voltage control section 15 and the output voltage V22 from the bias current detecting section 22 is obtained, and the difference thus obtained is amplified to a required level. An output voltage V23 of the DC photocurrent detecting section 23 is expressed by the following equation (2) with a differential amplification gain as G23 and a resistance value of the terminal resistor 6 as R6.

$$V23 = G23 \times (V22 - V\text{bias}) \quad (2)$$
$$= G23 \times \{G22 \times (Ir + I\text{photo\_dc}) - R6 \times Ir\}$$

Assume that the resistance value R6 of the terminal resistor 6 is set to be equal to the voltage conversion gain G22 of the bias current detecting section 22 (R6=G22). Then, the output voltage V23 described above is given by the following equation (3).

$$V23 = G23 \times G22 \times I\text{photo\_dc} \quad (3)$$

Accordingly, the output voltage V23 of the DC photocurrent detecting section 23 is a value of multiplying the DC component of the photocurrent. Since the DC component of the photocurrent corresponds to the power of the carrier light input to the EA modulator 3 from the semiconductor laser 2, it becomes possible to control the optical output power from the semiconductor laser 2 to be constant by feedback controlling the drive current of the semiconductor laser 2 in accordance with the output voltage V23 of the DC photocurrent detecting section 23. Here, in the comparison section 14, a difference of the output voltage V23 of the DC photocurrent detecting section 23 from a target value indicated by the output voltage of the DC photocurrent setting section 23 is obtained, and a control signal amplified with the difference is output to the LD current drive section 11 from the comparison section 14. Thus, the drive current of the semiconductor laser 2 is feedback controlled so that the DC component of the photocurrent coincides with the target value.

Next, the description will be given of a control operation for optimizing the amplitude of the modulated electric signal applied to the EA modulator 3 according to the AC component of the photocurrent generated in the EA modulator 3.

In the case where the amplitude of the modulated electric signal applied to the EA modulator 3 is set by a current source as shown in the configuration example of FIG. 12 above, voltages applied according to the photocurrent are different between the case where only the resistor 6 is connected to the modulation electrical output section 18 as a load and the case where the EA modulator 3 and the resistor 6 are connected in parallel to each other as loads. That is, since the photocurrent depends on the absorbance of the EA modulator 3, an amount of the voltage shift due to the photocurrent is varied with the on/off state of the optical output. Therefore, the amplitude voltage of the modulated electric signal output from the modulated electric signal output section 18 deviates from the value set by the modulated amplitude control section 16.

Figure 13:
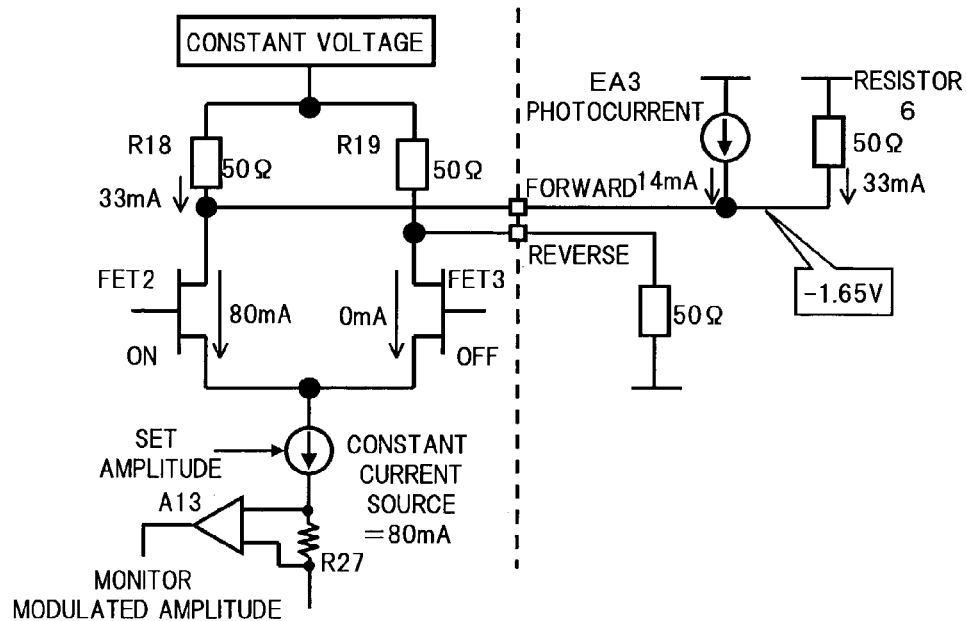
FIG. 13 is a diagram showing a simple model for explaining a relation between an AC component of photocurrent and an applied voltage to an EA modulator in the second embodiment.
Figure 13:
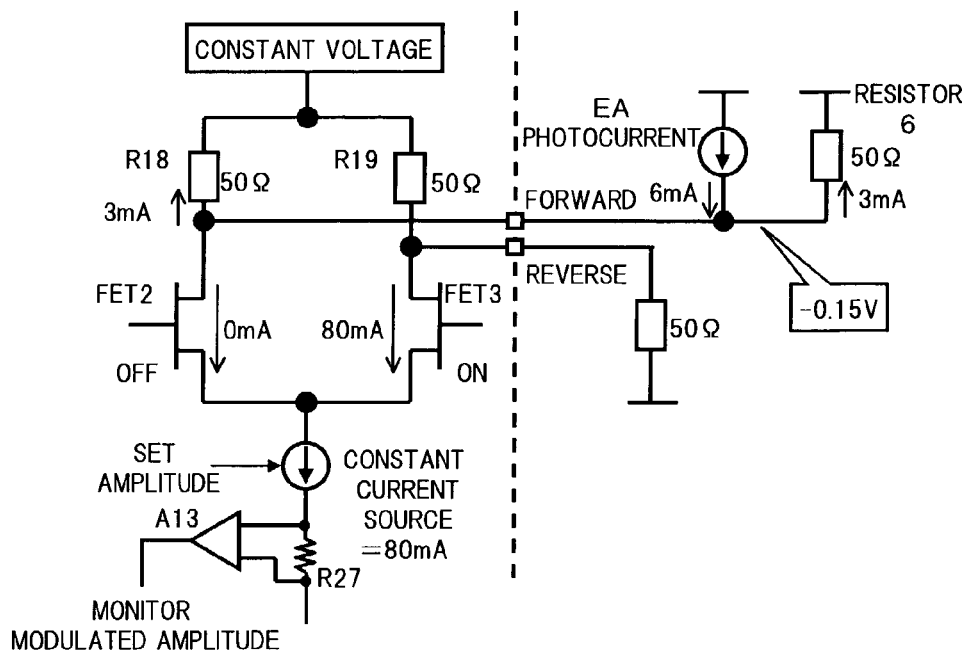

Specifically, as shown by a simple model of FIG. 13, for example, an example is considered where it is assumed that the set value of a constant current source for determining the modulated amplitude is 80 mA, the photocurrent flowing when the optical output is off is 14 mA and the photocurrent flowing when the optical output is on is 6 mA. In this assumption, in the case where the load in which the EA modulator 3 and the resistor 6 are connected in parallel to each other is connected to the modulated electric signal output section 18, a voltage of −1.65V is applied to the EA modulator 3 at a low level output (optical output is off) as shown in (A) of FIG. 13, and a voltage of 0.15V is applied to the EA modulator 3 when the output is at a high level output (optical output is on) as shown in (B) of FIG. 13. Therefore, the amplitude voltage of the modulated electric signal is 1.80V. On the other hand, a case is considered where only the resistor 6 is connected to the modulated electric signal output section 18, a voltage of −2.0V is applied to the resistor 6 when the output is at a low level and the voltage of 0.0V is applied to the resistor 6 when the output is at a high level. Thus, the amplitude voltage of the modulated electric signal is 2.0V.

Figure 14:
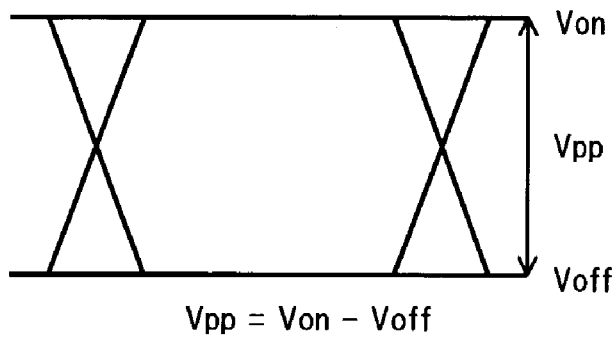
FIG. 14 is a conceptual diagram showing signal waveforms for explaining the relation between the AC component of photocurrent and the applied voltage to the EA modulator in the second embodiment.
Figure 14:
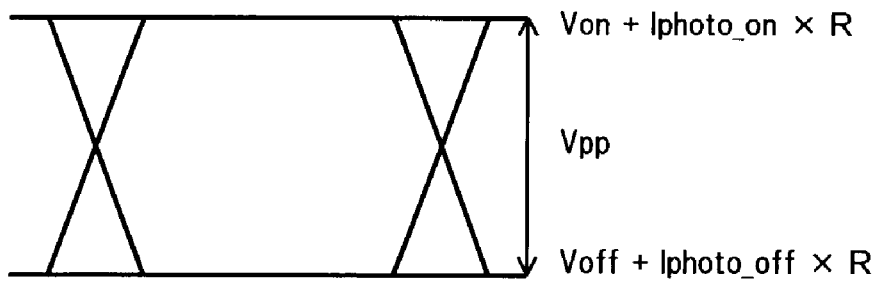

It will be understood that a deviation amount of the amplitude voltage of the modulated electric signal is dependent on the amplitude ΔIphoto of the photocurrent as shown in FIG. 14, for example. That is, the amplitude voltage Vpp of the modulated electric signal of the case where only the resistor 6 is the load as shown in (A) of FIG. 14, is a difference between a high level voltage Von and a low level voltage Voff (Vpp=Von−Voff). On the contrary, in the case where both the EA modulator 3 and the resistor 6 are loads as shown in (B) of FIG. 14B, an amplitude voltage Vpp of the modulated electric signal can be expressed by the following equation (4) with a value of the photocurrent when the optical output is on: Iphoto_on, and a value of the photocurrent when the optical output is off: Iphoto_off.

$$Vpp = (Von + \text{Iphoto\_on} \times R6) - (Voff + \text{Iphoto\_off} \times R6) \quad (4)$$
$$= Von - Voff + (\text{Iphoto\_on} - \text{Iphoto\_off}) \times R6$$
$$= Von - Voff + \Delta Iphoto \times R6$$

By detecting the amplitude ΔIphoto of the photocurrent, therefore, it becomes possible to judge the amplitude voltage of the modulated electric signal actually applied to the EA modulator 3.

In the configuration example shown in FIG. 12, the high and low level voltage values of the modulated electric signal being applied to the EA modulator 3 are detected by the high level detecting section 25 and the low level detecting section 26, respectively, and from each detection result, an amplitude voltage Vpp1 is detected by the peak detecting section 27. The amplitude voltage Vpp1 detected by the peak detecting section 27 corresponds to the equation (4) described above. On the other hand, the modulated amplitude monitor section 29 detects an amplitude voltage Vpp2 corresponding to the case where only the terminal resistance 6 is provided, without the EA modulator 3. This amplitude voltage is Vpp2=Von−Voff.

In the AC photocurrent detecting section 28, a difference between the amplitude voltage Vpp1 detected by the peak detecting section 27 and the amplitude voltage Vpp2 detected by the modulated amplitude monitor section 29 is obtained, to thereby detect the amplitude ΔIphoto of the photocurrent. An output voltage V28 of the AC photocurrent detecting section 28 is expressed by the following equation (5) with the differential amplification gain: G28.

$$V28 = G28 \times (Vpp1 - Vpp2) \quad (5)$$
$$= G28 \times R6 \times \Delta Iphoto$$

The output voltage V28 of the AC photocurrent detecting section 28 is compared with the set value of the AC photocurrent by the comparator 30, and the comparison result is transmitted to the modulated amplitude control section 16. Thus, the amplitude of the modulated electric signal is feedback controlled so that the amplitude of the photocurrent becomes the target value.

By the aforementioned series of control operation, it becomes possible to optimize the amplitude of the modulated electric signal applied to the EA modulator 3 according to the AC component of the photocurrent, to control an extinction ratio of the optical signal output from the EA modulator 3 to be constant.

As described above, with the drive circuit 10' in the second embodiment, by controlling the drive current of the semiconductor laser 2 according to the DC component of the photocurrent generated in the EA modulator 3, and at the same time, controlling the amplitude of the modulated electric signal of the EA modulator 3 according to the AC component of the photocurrent, it becomes possible to control the average output power and the extinction ratio of the optical signal output from the semiconductor laser module 1 to be constant without the need of controlling the module temperature with a Peltier device or the like. Also, the bias voltage applied to the EA modulator 3 and the cross point of the modulated electric signal are controlled according to the temperature detected by the temperature detecting section 20, in the same manner as in the first embodiment. Therefore, the waveform of the optical signal output from the semiconductor laser module 1 can also be controlled to be constant independently of the ambient temperature.

Figure 15:
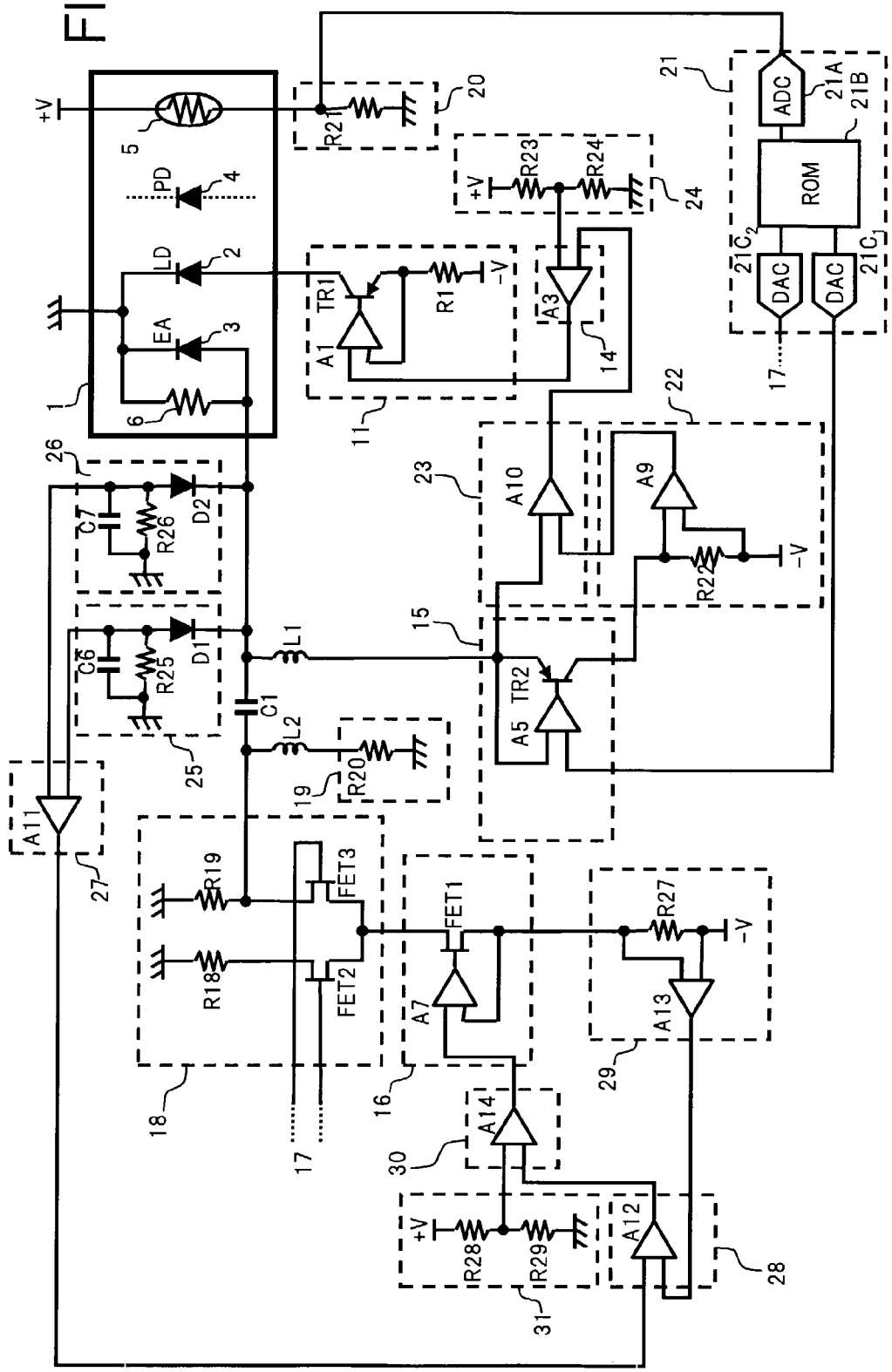
FIG. 15 is a circuit diagram showing another specific example of the second embodiment.

In the second embodiment described above, as shown in the configuration example of FIG. 12, the specific example has been shown where the bias voltage control section 15 or the like is linearly controlled according to the output voltage of the temperature detecting section 20. However, similarly to the configuration example shown in FIG. 4, the output voltage of the temperature detecting section 20 may be processed using the control LSI. A specific example of such a configuration is shown in FIG. 15. In the configuration example of FIG. 15, the output signal of the DAC 21C$_1$ of the control LSI 21 is supplied to the differential amplifier A5 of the bias voltage control section 15, and the output signal of the DAC 21C$_2$ is supplied to the cross point control section 17.

Also, in the second embodiment, the drive current of the semiconductor laser 2 and the modulated amplitude of the EA modulator 3 have been controlled according to the photocurrent generated in the EA modulator 3. However, one of the drive current of the semiconductor laser 2 and the modulated amplitude of the EA modulator 3 may be controlled according to the photocurrent, and the other of them may be controlled, similarly to the first embodiment, according to the output signal of the temperature detecting section.

What is claimed is:

1. A drive circuit for driving a semiconductor module including a semiconductor laser generating carrier light according to a drive current and an electro-absorption type optical modulator outputting an optical signal of which intensity is modulated by absorbing the carrier light output from said semiconductor laser according to a drive voltage, said drive circuit comprising:
   a laser drive unit supplying the drive current to said semiconductor laser;
   an optical modulator drive unit applying the drive voltage in which a modulated electric signal is superimposed on a bias voltage, to said electro-absorption type optical modulator;
   a temperature detection unit detecting the ambient temperature of said semiconductor laser and said electro-absorption type optical modulator; and
   a drive control unit controlling the drive current supplied by said laser drive unit and the drive voltage applied by said optical modulator drive unit, based on the temperature detected by said temperature detection unit, so that average power, an extinction ratio and an optical cross point of the carrier light output from said semiconductor laser are constant.

2. A drive circuit for a semiconductor laser module according to claim 1,
   wherein said drive control unit comprises:
   a laser drive control unit setting a reference value according to the temperature detected by said temperature detection unit and controlling the drive current supplied by said laser drive unit, so that power of the carrier light output from said semiconductor laser substantially coincides with said reference value; and
   an optical modulator drive control unit controlling the drive voltage supplied from said optical modulator drive unit, based on the temperature detected by said temperature detection unit, so that the average power, the extinction ratio and the optical cross point of the optical signal output from said electro-absorption type optical modulator are held to be constant.

3. A drive circuit for a semiconductor laser module according to claim 2,
   wherein said optical modulator drive control unit comprises a bias voltage control circuit controlling the setting of the bias voltage in said optical modulator drive unit according to the temperature detected by said temperature detection unit, so that the average power of the optical signal output from said electro-absorption type optical modulator is held to be constant.

4. A drive circuit for a semiconductor laser module according to claim 2,
   wherein said optical modulator drive control unit comprises a modulated amplitude control circuit controlling the setting of an amplitude of the modulated electric signal in said optical modulator drive unit according to the temperature detected by said temperature detection unit, so that an extinction ratio of the optical signal output from said electro-absorption type optical modulator is held to be constant.

5. A drive circuit for a semiconductor laser module according to claim 2,
   wherein said optical modulator drive control unit comprises a cross point control circuit controlling the setting of an electric cross point of the modulated electric signal in said optical modulator drive unit according to the temperature detected by said temperature detection unit, so that the optical cross point of the optical signal output from said electro-absorption type optical modulator is held to be constant.

6. A drive circuit for a semiconductor laser module according to claim 1, further comprising a photocurrent detection unit detecting a photocurrent generated as a result that the carrier light is absorbed by said electro-absorption type optical modulator,
   wherein said drive control unit controls the drive current supplied by said laser drive unit and the drive voltage applied by said optical modulator drive unit, based on the temperature detected by said temperature detection unit and the photocurrent detected by said photocurrent detection unit, so that the average power, the extinction ratio and the optical cross point of the carrier light output from said semiconductor laser are held to be constant.

7. A drive circuit for a semiconductor laser module according to claim 6,
   wherein said photocurrent detection unit comprises a DC photocurrent detection unit detecting a DC component of said photocurrent based on a bias voltage applied to said electro-absorption type optical modulator and a bias current flowing through said electro-absorption type optical modulator, and
   said drive control unit comprises a laser drive control unit controlling the drive current supplied by said laser drive unit, so that a value of the DC component of the photocurrent detected by said DC photocurrent detection unit substantially coincides with a preset reference value.

8. A drive circuit for a semiconductor laser module according to claim 6,
   wherein said photocurrent detection unit comprises an AC photocurrent detection unit detecting an amplitude of the AC component of said photocurrent based on a peak value of modulated amplitude of the drive voltage applied to said electro-absorption type optical modulator and a peak value of the amplitude setting of the modulated electric signal in said optical modulator drive unit, and said drive control unit comprises a modulated amplitude control unit controlling the amplitude setting of the modulated electric signal in said optical modulator drive unit so that the amplitude of the AC component of the photocurrent detected by said AC photocurrent detection unit substantially coincides with a preset reference value.

9. A method of driving a semiconductor module including a semiconductor laser generating carrier light according to a drive current and an electro-absorption type optical modulator outputting an optical signal of which intensity is modulated by absorbing the carrier light output from said semiconductor laser according to a drive voltage, said method comprising:

detecting the ambient temperature of said semiconductor laser and said electro-absorption type optical modulator; and controlling the drive current supplied to said semiconductor laser, and a bias voltage and a modulated electric signal applied to said electro-absorption type optical modulator, based on the detected temperature, so that average power, an extinction ratio and an optical cross point of the carrier light output from said semiconductor laser are constant.

10. A method of driving a semiconductor module including a semiconductor laser generating carrier light according to a drive current and an electro-absorption type optical modulator outputting an optical signal of which intensity is modulated by absorbing the carrier light output from said semiconductor laser according to a drive voltage, said method comprising:

detecting the ambient temperature of said semiconductor laser and said electro-absorption type optical modulator, and at the same time, detecting a photocurrent generated as a result that the carrier light is absorbed by said electro-absorption type optical modulator; and controlling the drive current supplied to said semiconductor laser, and a bias voltage and a modulated electric signal applied to said electro-absorption type optical modulator, based on the detected temperature and photocurrent, so that average power, an extinction ratio and an optical cross point of the carrier light output from said semiconductor laser are constant.

11. A method of controlling a laser module, comprising:

establishing a desired average power, a desired extinction ratio, and a desired optical cross point associated with an optical signal output by the laser module;

sensing a temperature associated with the laser module; and without controlling the temperature of the laser module, using the sensed temperature to control a drive voltage applied to a modulator associated with the laser module and a drive current applied to a laser associated with the laser module so that the laser module outputs an optical signal having the desired average power, the desired extinction ratio, and the desired optical cross point.

12. A method comprising:

generating a carrier light from a semiconductor laser, according to a drive current supplied to the semiconductor laser;

applying a drive voltage in which a modulated electric signal is superimposed on a bias voltage, to an electro-absorption type optical modulator, to thereby cause the electro-absorption type modulator to output an optical signal;

absorbing the carrier light output from the semiconductor laser to modulate an intensity of the optical signal;

detecting the ambient temperature of the semiconductor laser and the electro-absorption type optical modulator; and controlling the drive current supplied to the semiconductor laser, and the bias voltage supplied to said electro-absorption type optical modulator, based on the detected temperature, so that an average power, an extinction ratio and an optical cross point of the carrier light output from said semiconductor laser are constant.

13. An apparatus comprising:

means for generating a carrier light from a semiconductor laser, according to a drive current supplied to the semiconductor laser;

means for applying a drive voltage in which a modulated electric signal is superimposed on a bias voltage, to an electro-absorption type optical modulator;

means for outputting an optical signal using the electro-absorption type modulator, the intensity of the optical signal modulated by absorbing the carrier light output from the semiconductor laser in accordance with the drive voltage;

means for detecting the ambient temperature of the semiconductor laser and electro-absorption type optical modulator; and means for controlling the drive current supplied to the semiconductor laser, and the bias voltage supplied to said electro-absorption type optical modulator, based on the detected temperature, so that an average power, an extinction ratio and an optical cross point of the carrier light output from the semiconductor laser are constant.

* * * * *